(12) United States Patent
Havemann

(10) Patent No.: US 6,365,451 B2
(45) Date of Patent: Apr. 2, 2002

(54) TRANSISTOR AND METHOD

(75) Inventor: Robert H. Havemann, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/821,602

(22) Filed: Mar. 29, 2001

Related U.S. Application Data

(62) Division of application No. 09/212,136, filed on Dec. 15, 1998.
(60) Provisional application No. 60/069,917, filed on Dec. 17, 1997.

(51) Int. Cl.[7] .......................................... H01L 21/8238
(52) U.S. Cl. ....................... 438/230; 438/320; 438/366; 438/696
(58) Field of Search ................................ 438/229, 230, 438/233, 299, 301, 302, 303, 304, 305, 320, 364, 366, 369, 696, 231, 306

(56) References Cited

U.S. PATENT DOCUMENTS

| | | | |
|---|---|---|---|
| 4,873,557 A | | 10/1989 | Kita ........................... 357/23.1 |
| 4,948,745 A | * | 8/1990 | Pfiester et al. .............. 438/290 |
| 5,200,352 A | * | 4/1993 | Pfiester ....................... 438/231 |
| 5,397,722 A | * | 3/1995 | Bashir et al. ................ 438/296 |
| 5,439,839 A | | 8/1995 | Jang ............................. 437/44 |
| 5,451,532 A | * | 9/1995 | Bashir et al. ............... 438/366 |
| 5,506,161 A | * | 4/1996 | Orlowski et al. ........... 438/231 |
| 5,672,530 A | * | 9/1997 | Hsu ............................. 438/296 |
| 5,940,711 A | | 8/1999 | Zambrano .................... 438/366 |
| 6,017,823 A | * | 1/2000 | Shishiguchi et al. ........ 438/230 |
| 6,177,325 B1 | * | 1/2001 | Jang ............................. 438/318 |

OTHER PUBLICATIONS

"Sub–50NM Gate Length N–MOSFETs With 10 NM Phosphorus Source and Drain Junctions," 1993 IEEE, pp. 6.2.1–6.2.4 (Mizuki Ono, Masanobu Saito, Takashi Yoshitomi, Claudio Fiegna, Tatsuya Ohguro and Hiroshi Iwai) Electronic Device, Meeting, 1993.

* cited by examiner

Primary Examiner—John F. Niebling
Assistant Examiner—Christopher Lattin
(74) Attorney, Agent, or Firm—David Denker; Wade James Brady III; Frederick J. Telecky Jr.

(57) ABSTRACT

A method of fabricating a semiconductor device and the device. The device is fabricated by providing a substrate having a region thereover of electrically conductive material, and a dielectric first sidewall spacer on the region of electrically conductive material. A second sidewall spacer is formed over the first sidewall spacer extending to the substrate from a material which is selectively removal relative to the first sidewall spacer. An electrically conductive region is formed contacting the second sidewall spacer and spaced from the substrate. The second sidewall spacer is selectively removable to form an opening between the substrate and the electrically conductive region. The opening is filled with electrically conductive material to electrically couple the electrically conductive material to the substrate.

8 Claims, 2 Drawing Sheets

TRANSISTOR AND METHOD

This application is a divisional of Appl. Ser. No. 09/212,136, filed Dec. 15, 1999, which claims priority from provisional Appl. Ser. No. 60/069,917, filed Dec. 17, 1997.

BACKGROUND OF THE INVENTION

The invention relates to electronic semiconductor devices and integrated circuits, and more particularly to fabrication methods of MOS and bipolar transistors in integrated circuits.

In the fabrication of semiconductor devices, it is well known that parasitic capacitances tend to decrease the operating speed of the devices. Accordingly, the industry is constantly attempting to decrease parasitic capacitance to obtain the concomitant increase in device operating speed.

Such parasitic capacitances arise whenever there are two charge carrying locations in the device or between the device and an external location separated by a dielectric. With the continued miniaturization of semiconductor devices, the distances between these charge carrying locations decreases and the thicknesses of the dielectrics also decreases, thereby increasing the parasitic capacitance within the device being fabricated. Also, the doping levels have been increasing, this also leading to an increase in capacitance.

SUMMARY OF THE INVENTION

The present invention provides small contacts by use of sidewall removals to form the contact openings.

This has the advantage of permitting small source/drains in MOS and small extrinsic bases in bipolar transistors with consequent small junction capacitance.

BRIEF DESCRIPTION OF THE DRAWINGS

The drawings are schematic for clarity.

DESCRIPTION OF THE PREFERRED EMBODIMENTS

Overview

The preferred embodiments provide small contacts to substrate regions by selectively removing the outer one of two sidewall dielectric layers and refilling the resultant opening with a conductor to make contact to the underlying substrate. Thus the contact opening size is controlled by the thickness of the sidewall dielectric layer thickness, and this contact opening can be used for introduction of dopants to form a source/drain or an extrinsic base.

Figure 3A:
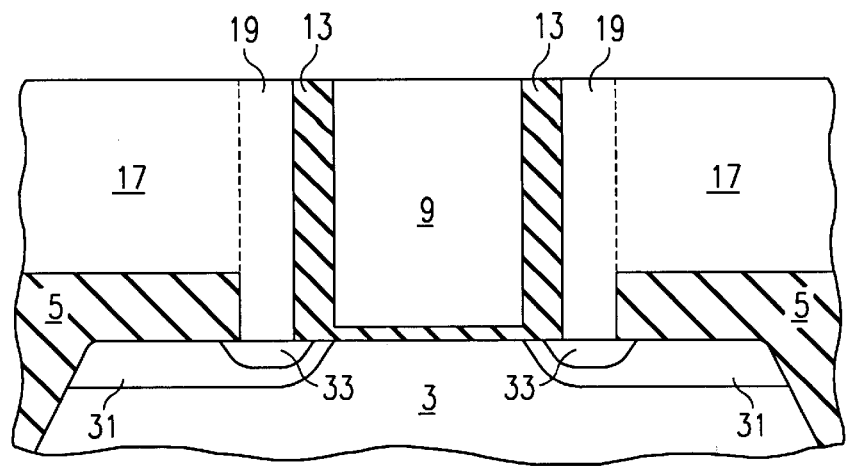
FIGS. 3a–b show a salicide version of the MOS transistor.
Figure 3B:
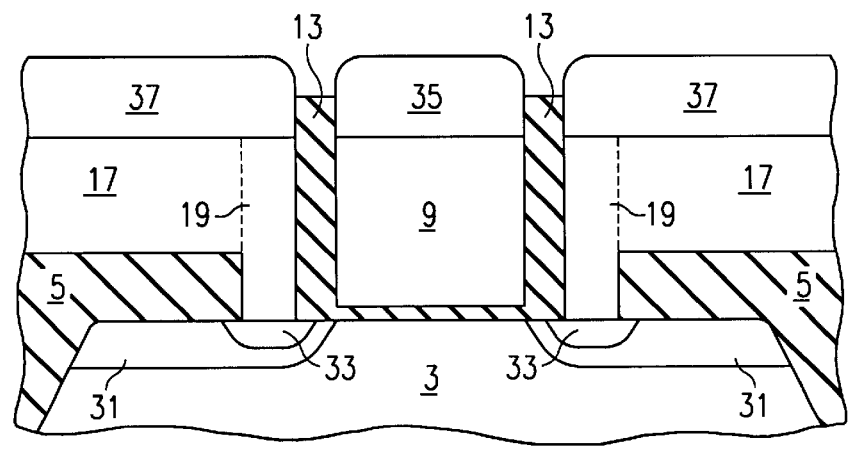

For MOS transistors (as illustrated in cross sectional elevation view in FIGS. 1c, 3b, and 4), this second sidewall dielectric removal permits the length of the contact openings to the source and drain to be narrower than half the gate length and thus be of sublithographic size. Also, the heavily doped source and drain may be formed by dopant introduction through these contact openings and thus provide small regions with consequent decreased parasitic capacitance.

For bipolar transistors (illustrated in FIG. 2), this permits the size of the extrinsic base to be small and separated from the emitter only by the first dielectric sidewall spacer on the polysilicion emitter. This reduces parasitic capacitance.

MOS Transistor

Figure 1A:
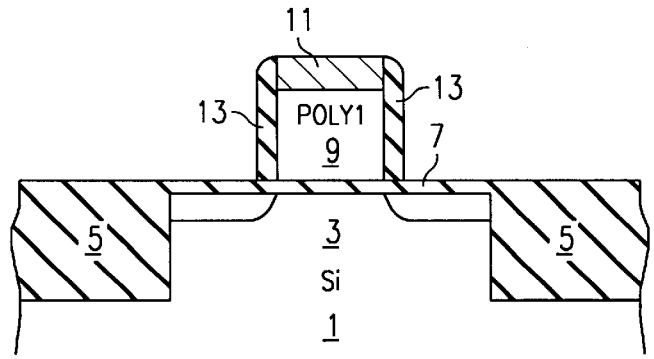
FIGS. 1a–c show process steps for a MOS transistor.
Figure 1B:
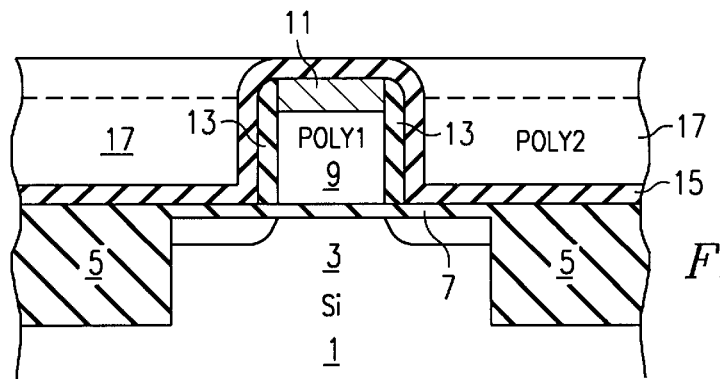
Figure 1C:
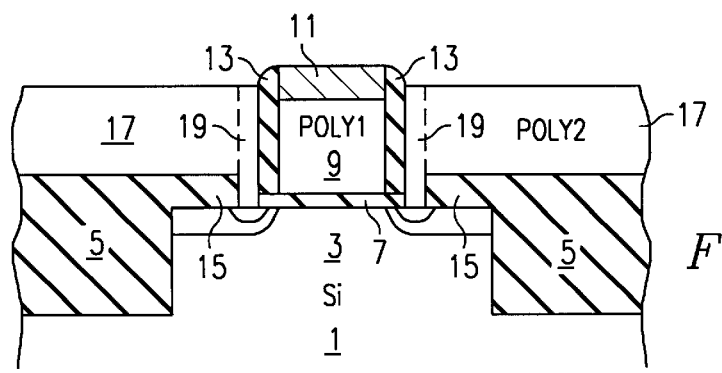

FIG. 1c is a cross sectional elevation view of a first preferred embodiment MOS transistor with polysilicon gate 9 of length 130 nm, gate oxide 7 of thickness 2 nm, oxide sidewall spacers 13 of thickness 30 nm, polysilicon source/drain contacts 19 with length 30 nm at the source/drain, shallow trench isolation oxide 5, and electrodes 19. The ratio of the contact length to the gate length thus is much less than one half, and the source/drains formed by dopant introduction through the contact opening may also have length of less than half the gate length. Indeed, the contact opening is roughly one quarter of the gate length in FIG. 1c.

Fabrication Method

A preferred embodiment fabrication process for formation of a MOS transistor commences in standard manner as shown in FIG. 1a with a silicon substrate 1 having an active device region which is isolated on the chip by a shallow trench isolation (STI) oxide 5 which surrounds the active device region and is formed in standard manner such as etch trenches, grow interface oxide, deposit oxide in a high density plasma to fill trenches, and planarize.

A first layer of 2 nm thick gate oxide 7 is grown or deposited over the active device region 3 and extends to and becomes a part of the trench oxide 5. A polysilicon gate 9 is then formed over the portion of the first layer of gate oxide 7 as well as over the active device region 3 with a hard mask 11 which is disposed on the upper surface of the gate 9. The hard mask 11 is sufficiently thick or selective to the subsequent etch used in forming the gate sidewall spacers 13 to remain after sidewall spacer formation. If the hard mask 11 and sidewall spacer 13 are made of silicon nitrides, then the second dielectric layer 15 discussed below will be an oxide, and vice versa to insure selective etchability as discussed herein. The hard mask 11 can be patterned over a first 300 nm thick layer of polysilicon with subsequent etching of the first layer of polysilicon to provide the gate 9 with the hard mask thereon. A lightly doped drain implant through the exposed gate oxide 7 follows the gate formation.

The sidewall spacer 13, which can be an oxide or nitride as discussed above and which will be assumed to be an oxide for this embodiment, is then formed on the sidewalls of gate 9 as well as on the sidewalls of the hard mask 11 by standard deposition of a 30 nm thick film followed by anisotropic etchback. The etchback may remove the exposed portion of oxide 7.

A second 30 nm thick dielectric layer 15, which can be silicon oxide or nitride but which must be selectively etchable to the sidewall spacers 13, is then conformally deposited over the entire structure to provide some offset and to provide the region which will eventually be used to form the contact opening to the source/drain. This is followed by a similar second deposition of polysilicon 17 to which the source/drain will be ultimately connected. The second polysilicon 17 is planarized (e.g., by chemical mechanical polishing) and then the polysilicon is etched back to expose dielectric 15 on hard mask 11 as illustrated by the broken line in FIG. 1b. Of course, polysilicon 17 could be replaced with another conductor such as tungsten on a titanium nitride barrier layer.

Selectively etch away the sidewall portion of dielectric 15 to leave a 30 nm thick slot-like opening with sidewall spacer 13 on one side and polysilicon 17 on the other and the substrate (or any oxide 7 still present) on the bottom. An anisotropic etch insures that lateral etching of dielectric 15 under polysilicon 17 is limited. Then etch away any exposed oxide 7 if necessary. The active area 3 is sxposed at the bottom of the opening, and the heavily doped source/drain regions may now be formed in the substrate by implantation, plasma implantation, or gas phase doping; or by diffusion out of the conductor 19 which is deposited to fill the opening in the next step.

Fill the opening created by the removal of dielectric 15 (and exposed gate oxide 7) with a conductor such as doped polysilicon or a metal like titanium or titanium followed by titanium nitride via a conformal deposition. Then etch back the conductor to achieve the device of FIG. 1c which shows polysilicon. For titanium fill, the titanium may be reacted with the source/drain silicon to form titanium silicide; similarly if tungsten, cobalt, nickel, platinum, et cetera had used to fill the opening. This fill material thus provides a contact between the second polysilicon layer 17 and the source/drains in the silicon substrate.

The second polysilicon layer 17 is then patterned in standard manner, premetal level dielectric formed, metal interconnects, intermetal level dielectrics, and passivation steps complete an integrated circuit.

Bipolar Transistor

Figure 2:
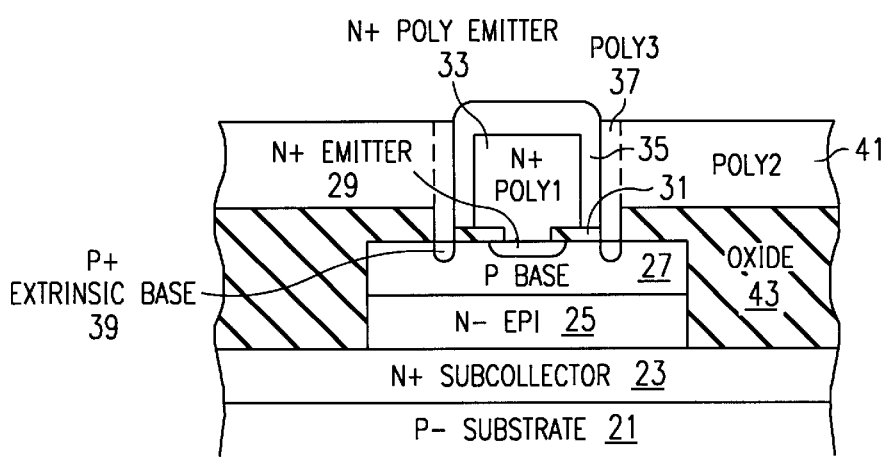
FIG. 2 shows a bipolar transistor.

FIG. 2 illustrates in cross sectional elevation view a preferred embodiment bipolar transistor using the selective removal of the second dielectric. In particular, in the fabrication of a bipolar device the primary difference over the foregoing discussed fabrication of a MOS device includes substrate doping: providing p-type substrate 21 which has an $n^+$-type subcollector 23 implanted therein. An n-type epitaxial layer 25 is formed over the subcollector 23 with a p-type base 27 thereover, and an $n^+$-type emitter 29 is formed in the base, all in standard manner as shown. The oxide layer 31 is formed over the base and the polysilicon emitter 33 is formed after removal of a portion of the oxide layer 31 to allow diffusion of the $n^+$ dopant into the base and to make contact between the polysilicon emitter 33 and the emitter region 29. A hard mask is on the top of the polysilicon emitter 33; a dielectric spacer 35 is formed over the top and sidewalls of the emitter 33, and the process proceeds with a second dielectric in the same manner as in the fabrication of the MOS device to provide a polysilicon coupling 37 to the $p^+$-type extrinsic base 39 and to the layer of polysilicon 41 disposed over the oxide region 43. The diffusion from the polysilicon 37 is nominally p-type to form the extrinsic base or base contact.

Salicided MOS Transistor

A self-aligned silicide (salicide) process can be used with the MOS preferred embodiment as follows. After the contact openings have been filled with polysilicon 19 as in FIG. 1c, pattern the polysilicon, deposit dielectric, planarize with chemical mechanical polishing to remove dielectric, the hard mask 11, and polysilicon to reduce the polysilicon thickness to about 150–200 nm. See FIG. 3a which also shows lightly doped source/drains 31 and heavily doped source/drains 33.

Next, deposit a 50 nm thick layer of cobalt, and react the cobalt with the underlying polysilicon (both the polysilicon gate 9 and the polysilicon 17–19) to form $CoSi_2$. The silicidation reaction may be in one or two steps at differing or the same temperatures. Lastly, remove the unreacted cobalt which was on dielectric. The silicidation consumes about 50 nm of polysilicon to form about 100 nm thick $CoSi_2$ layers 35 on gate 9 and 37 on polysilicon 17–19; see FIG. 3b.

Metal Gate MOS

A metal gate and metal contact preferred embodiment may be derived from the foregoing polysilicon MOS preferred embodiment (FIGS. 1a–1c) simply by using metal (such as tungsten on a titanium nitride barrier) in place of polysilicon.

Figure 4:
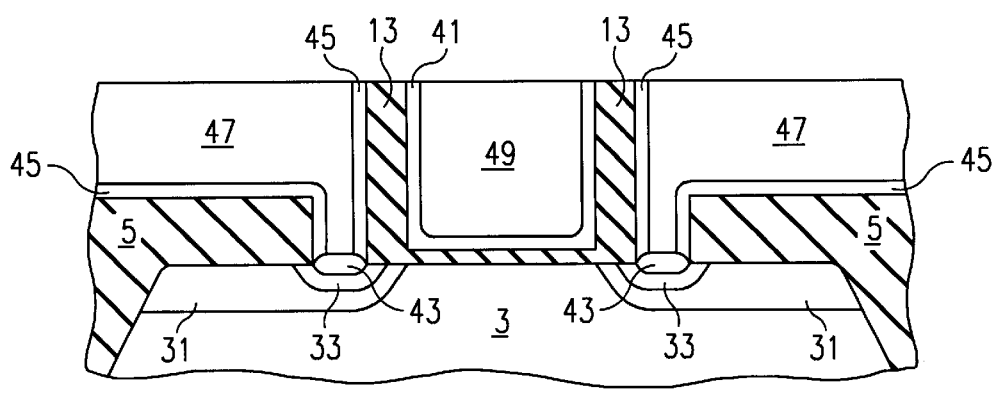
FIG. 4 shows a metal gate version of the MOS transistor.

Another metal gate and metal contact preferred embodiment can be derived as follows. Starting with the structure of FIG. 3a, remove all of the polysilicon with a choline etch, this is a timed etch to limit the amount of substrate silicon also removed. Then deposit a 10–20 nm thick layer of titanium and react the titanium contacting the silicon substrate at the source/drains in a nitrogen atmosphere with rapid thermal processing. This forms titanium silicide at the source/drains and titanium nitride elsewhere including a thin film of titanium nitride on top of the titanium silicide. Then deposit tungsten and apply chemical mechanical polishing to reduce the metal thickness to reveal the dielectric 13 which thereby separates the metal gate and to about 200–300 nm. See FIG. 4 showing titanium nitride 41 and tungsten 49 form the metal gate and titanium silicide 43 on heavily doped source/drains 33, plus titanium nitride 45 and tungsten 47 forming the metal contacts.

Modifications

The preferred embodiments may be varied in many ways while retaining one or more of their features of a contact derived from the removal of a sidewall dielectric.

In particular, the dimensions of the components in the preferred embodiments can be varied such as the gate length could be any of the expected standard lengths of 250 nm, 180 nm, 130 nm, 100 nm, et cetera, and the corresponding contact opening size and sidewall dielectric thicknesses similarly varied. Indeed, the sidewall dielectrics could be formed as two or more sublayers, the materials may be varied such as the inner dielectric could be nitride on oxide and the removed dielectric could be oxide or nitride on oxide for use with two step removal. Of course, the dielectric layers may be of differing thicknesses, so the contact opening and the sidewall spacer may have differing sizes. Further, the gate material may differ from the contact material which itself may include multiple materials such as in FIG. 1c the material 17 could differ from the contact opening fill material 19.

What is claimed is:

1. A method of fabricating a semiconductor device which comprises the steps of:
   (a) providing a substrate having a first region thereover of electrically conductive material, a dielectric first sidewall spacer on said first region of electrically conductive material;
   (b) forming a second sidewall spacer over said first sidewall spacer extending to said substrate from a material which is selectively removable relative to said first sidewall spacer;
   (c) forming a second electrically conductive region contacting said second sidewall spacer and spaced from said substrate;
   (d) selectively removing said second sidewall spacer relative to said first sidewall spacer to form an opening extending between said substrate and said second electrically conductive region; and
   (e) filling said opening with electrically conductive material to electrically couple said second electrically conductive region to said substrate.

2. The method of claim 1 further including the step of providing in step (a) a dielectric layer between said first region of electrically conductive material and said substrate.

3. The method of claim 1 further including the step of implantation source/drain regions into said substrate prior to step (e) using said first sidewall spacer as a portion of the implant mask.

4. The method of claim 2 further including the step of implantation source/drain regions into said substrate prior to step (e) using said first sidewall spacer as a portion of the implant mask.

5. The method of claim 1 wherein said first region of electrically conductive material is polysilicon, said first sidewall spacer is one of silicon oxide or silicon nitride and said second sidewall spacer is the other of silicon oxide or silicon nitride.

6. The method of claim 2 wherein said first region of electrically conductive material is polysilicon, said first sidewall spacer is one of silicon oxide or silicon nitride and c.said second sidewall spacer is the other of silicon oxide or silicon nitride.

7. The method of claim 3 wherein said first region of electrically conductive material is polysilicon, said first sidewall spacer is one of silicon oxide or silicon nitride and said second sidewall spacer is the other of silicon oxide or silicon nitride.

8. The method of claim 4 wherein said first region of electrically conductive material is polysilicon, said first sidewall spacer is one of silicon oxide or silicon nitride and said second sidewall spacer is the other of silicon oxide or silicon nitride.

* * * * *